(12) United States Patent
Carlson (10) Patent No.: US 12,334,940 B2
(45) Date of Patent: Jun. 17, 2025

(54) STABLE SCALABLE DIGITAL FREQUENCY REFERENCE

(71) Applicant: National Research Council of Canada, Ottawa (CA)

(72) Inventor: Brent Carlson, Penticton (CA)

(73) Assignee: National Research Council of Canada, Ottawa (CA)

( * ) Notice: Subject to any disclaimer, the term of this patent is extended or adjusted under 35 U.S.C. 154(b) by 35 days.

(21) Appl. No.: 17/776,322

(22) PCT Filed: Nov. 13, 2020

(86) PCT No.: PCT/CA2020/051560
§ 371 (c)(1),
(2) Date: May 12, 2022

(87) PCT Pub. No.: WO2021/092704
PCT Pub. Date: May 20, 2021

(65) Prior Publication Data
US 2022/0399896 A1    Dec. 15, 2022

Related U.S. Application Data

(60) Provisional application No. 62/934,864, filed on Nov. 13, 2019.

(51) Int. Cl.
*H03L 7/099* (2006.01)
*H03L 7/14* (2006.01)
*H03L 7/24* (2006.01)

(52) U.S. Cl.
CPC ............ *H03L 7/0991* (2013.01); *H03L 7/141* (2013.01); *H03L 7/24* (2013.01)

(58) Field of Classification Search
CPC ..................................................... H03L 7/0991
USPC ......................................................... 375/376
See application file for complete search history.

(56) References Cited

U.S. PATENT DOCUMENTS

| | | |
|---|---|---|
| 6,822,488 B1 | 11/2004 | Riley |
| 8,244,192 B2 | 8/2012 | Prasidh et al. |
| 10,063,245 B2 | 8/2018 | Hashimoto |
| 2001/0022536 A1* | 9/2001 | Kallio .................. H03L 7/00 331/25 |
| 2006/0291537 A1* | 12/2006 | Fullerton ........... G06K 7/10306 375/130 |
| 2007/0058748 A1* | 3/2007 | Kim .................... H04B 1/52 375/295 |

(Continued)

OTHER PUBLICATIONS

Extended European Search Report issued in corresponding European Patent Application No. 20887034.5, Nov. 14, 2023, 7 pages.

(Continued)

*Primary Examiner* — Lihong Yu
(74) *Attorney, Agent, or Firm* — Aird & McBurney LP (57) ABSTRACT

A method for timing aperture synthesis arrays comprising the steps of: (a) coupling a plurality of independent crystal oscillators, each of the plurality of independent crystal oscillators having a unique output frequency; (b) digitally synchronizing the plurality of independent crystal oscillators in phase; (c) combining the unique output frequencies; and (d) obtaining a stable digital reference signal for timing at least one remote radio device of the aperture synthesis array.

6 Claims, 8 Drawing Sheets

(56) References Cited

U.S. PATENT DOCUMENTS

2018/0239307 A1\* 8/2018 Tsutsumi ............... H03L 7/087

OTHER PUBLICATIONS

Zhang, Y., et al. "DDS-PLL phased source for Ka-band beam control phased array receiver." 2018 12th International Symposium on Antennas, Propagation and EM Theory (ISAPE). IEEE, Dec. 3, 2018, pp. 1-4.
Larcher, J., et al. "Frequency synthesizers for radio equipment." Philips Telecommunication Review 27(4), Jul. 31, 1968, pp. 149-166.
International Search Report and Written Opinion for PCT/CA2020/051560.
Lowery, A. J. et al. "Widely-tunable low-phase-noise coherent receiver using an optical Wadley loop." Optics Express 23.15 (2015): 19891-19900.
Carlson, B. R. "Incoherent clocking in coherent radio interferometers." Electronics Letters 54.14 (2018): 909-911.
Delos, P. et al. "RF Transceivers Enable Forced Spurious Decorrelation in Digital Beamforming Phased Arrays." Microwave Journal 62.4 (2019): 80-88.
Buono, P-L. et al. "Phase drift on networks of coupled crystal oscillators for precision timing." Physical Review E 98.1 (2018): 012203.
Lauritzen, K. C. "Correlation of signals, noise, and harmonics in parallel analog-to-digital converter arrays." University of Maryland, College Park, 2009.
Lauritzen, K. C. et al. "Impact of decorrelation techniques on sampling noise in radio-frequency applications." IEEE Transactions on Instrumentation and Measurement 59.9 (2010): 2272-2279.

\* cited by examiner

Streaming packets to noisy clock detail

US 12,334,940 B2
STABLE SCALABLE DIGITAL FREQUENCY REFERENCE

FIELD

The present disclosure relates to aperture synthesis antenna arrays, and more particularly it relates to providing an ultra-stable frequency reference used at each antenna of an aperture synthesis antenna array.

BACKGROUND

Aperture synthesis, combining individual antennas through interferometry, has enabled radio telescopes to make images of exquisite detail, high sensitivity and excellent fidelity. Many telescopes, such as the Event Horizon Telescope (EHT) which is capable of imaging a black hole in the core of a distant galaxy, or the Square Kilometre Array (SKA), are aperture synthesis telescopes of unprecedented sensitivity.

The technique of aperture synthesis using interferometry involves employing an array of N antennas to synthesize an aperture the physical extent of the array, thereby obtaining virtually unlimited spatial resolving power. It is a technique that overcomes the physical limitations encountered in trying to build a single large antenna to obtain a large aperture. For example, aperture synthesis arrays can and are built with apertures of 1000's of kilometres, whereas a single large antenna of that size is clearly impossible. An aperture synthesis image has a field of view (FOV) of $\sim\lambda/D_{antenna}$ ($\lambda$=wavelength of the emission; $D_{antenna}$=diameter of an antenna) with a spatial resolution (i.e. image pixel size) of $\sim\lambda/D_{array}$, and with a sensitivity proportional to the total collecting area of all of the antennas in the array, the square-root of the bandwidth they receive, and inversely proportional to the receiver noise level. To synthesize an aperture, wavefront sampling (digitizer) clocks must be precisely and accurately synchronized in time across the array. For extended arrays such as the EHT it is not possible to distribute an accurately synchronized coherent clock to all antennas in the array due to the vast distances involved and therefore each antenna operates with its own atomic clock, normally a Hydrogen maser (H-maser). This provides a reasonable coherence time for the array, however, due to the fact that the clocks are not tied to a central reference, drifts occur and such drifts are measured and removed by more frequently observing astronomical calibrator sources, than would otherwise be necessary due to the atmosphere alone. This uses up valuable observing time that otherwise could be spent on the target science source.

It is an object of the present disclosure to mitigate or obviate at least one of the above-mentioned disadvantages.

SUMMARY

In one aspect, there is provided a method for timing aperture synthesis arrays comprising the steps of:
 (a) coupling a plurality of independent crystal oscillators, each of the plurality of independent crystal oscillators having a unique output frequency;
 (b) digitally synchronizing the plurality of independent crystal oscillators in phase and frequency;
 (c) combining the unique output frequencies; and
 (d) thereby obtaining a stable digital reference signal for timing remote radio devices.

In another aspect, there is provided a method for implementing a scalable stable digital frequency reference using a plurality of independent clock source circuitry, the method comprising the steps of:
 (a) for each of the plurality of independent clock source circuitry, providing a clock signal from an independent clock source as a first input into a direct digital synthesizer;
 (b) setting an initial phase and phase increment clock source cycle for each direct digital synthesizer during initialization to align the direct digital synthesizers in phase and frequency;
 (c) sampling an output phase of each direct digital synthesizer into a common synchronous clock domain;
 (d) generating a precision digital complex tone for each direct digital synthesizer;
 (e) adding the precision digital complex tone in-phase to other precision digital complex tones for each of the other direct digital synthesizers to generate a collective coherent vector sum;
 (f) providing the collective coherent vector sum as a feedback input into each phase and frequency measurement block of the plurality of independent clock source circuitry; and
 (g) conditioning the collective coherent vector sum and outputting a scalable stable digital frequency reference clock.

In another aspect, there is provided a system for implementing a scalable stable digital frequency reference, the system comprising:
 a plurality of independent crystal oscillator circuitry coupled to each other, each of the plurality of independent crystal oscillator circuitry comprising:
  (a) an independent crystal oscillator;
  (b) a direct digital synthesizer having a first input from the independent crystal oscillator and second input comprising an adjustable phase increment clock source cycle to align all direct digital synthesizers in frequency;
  (c) a phase sampler for sampling an output phase of each direct digital synthesizer into a common synchronous clock domain;
  (d) a sin/cos look-up table stored in a computer-readable medium, wherein the sin/cos look-up table generates a precision digital tone;
  (e) a collective coherent vector sum module for combining the precision digital complex tone in-phase to other precision digital complex tones for each of the other direct digital synthesizer to generate a collective coherent vector sum;
  (f) a phase management block wherein each of the plurality of independent crystal oscillator circuitry compares its own sin/cos vector with the collective coherent vector sum to determine requisite phase and frequency corrections of its own direct digital synthesizer; and
  (g) a conditioner for conditioning the collective coherent vector sum and outputting the scalable stable digital frequency reference.

Advantageously, in the present system and method, an array of independent crystal oscillators is digitally phase-aligned to obtain the frequency stability of the collective independent crystal oscillators i.e. a scalable stable digital frequency reference (SSDFR). While the exact frequency of the collective is unknown, the frequency is stable and scalable to virtually any stability, since the SSDFR system is entirely digitally-based. Accordingly, in one implementation, a stable frequency reference is generated for timing remote radio telescopes relative to a common but relatively unstable frequency reference (e.g. geostationary satellite carrier tone, with its phase detected at each remote RT varying differently over periods of 1-1000's of seconds due to the atmosphere) by using a stable reference, in which the instability of the common reference phase seen at each radio telescope can potentially be integrated down to an acceptable level to achieve radio telescope array coherence. This reference has a better frequency stability than a hydrogen maser atomic clock, however, and furthermore, advantageously its actual frequency need not be known in the intended application.

In addition, the scalable array of digitally-synchronized, statistically-averaged, low-cost crystal oscillators may be used as an alternative to independent atomic clocks for aperture synthesis arrays of widely-separated radio antennas. As well as potentially saving money, the use of such a "scalable, stable, digital frequency reference" simplifies image processing and increases observing efficiency, since one does not need to observe astronomical calibrators to measure atomic clock drift.

The method proposed here overcomes the need for H-masers at each antenna and frequent clock-drift astronomical calibrations, by equipping each antenna with a stable scalable digital frequency reference with a coherence time (i.e. clock drift) that is greater than the atmosphere with the caveats that a) the precise frequency of this reference is not known and b) that the antennas be tied to a central reference via an unstable media, such as a packet switched network or a co-observed satellite carrier tone. In addition, the present system and method eliminate the need for H-masers at each antenna and provide improved observing efficiency for antennas connected to a central site via unstable media as described.

As an example of the potential cost savings, in the development of next generation Very Large Array (ngVLA), replacing atomic clocks with the SSDFR for the outer 80 antennas could save another US$10 M (approximately), but more importantly increase observing efficiency and simplify image processing. This technology facilitates a simpler, more efficient, lower cost, and more homogeneous architecture for the ngVLA.

DETAILED DESCRIPTION

The detailed description of exemplary embodiments of the invention herein makes reference to the accompanying block diagrams and schematic diagrams, which show the exemplary embodiment by way of illustration and its best mode. While these exemplary embodiments are described in sufficient detail to enable those skilled in the art to practice the invention, it should be understood that other embodiments may be realized and that logical and mechanical changes may be made without departing from the spirit and scope of the invention. Thus, the detailed description herein is presented for purposes of illustration only and not of limitation. For example, the steps recited in any of the method or process descriptions may be executed in any order and are not limited to the order presented.

Moreover, it should be appreciated that the particular implementations shown and described herein are illustrative of the invention and are not intended to otherwise limit the scope of the present disclosure in any way. Indeed, for the sake of brevity, certain sub-components of the individual operating components, conventional data networking, application development and other functional aspects of the systems may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical system.

Figure 1:
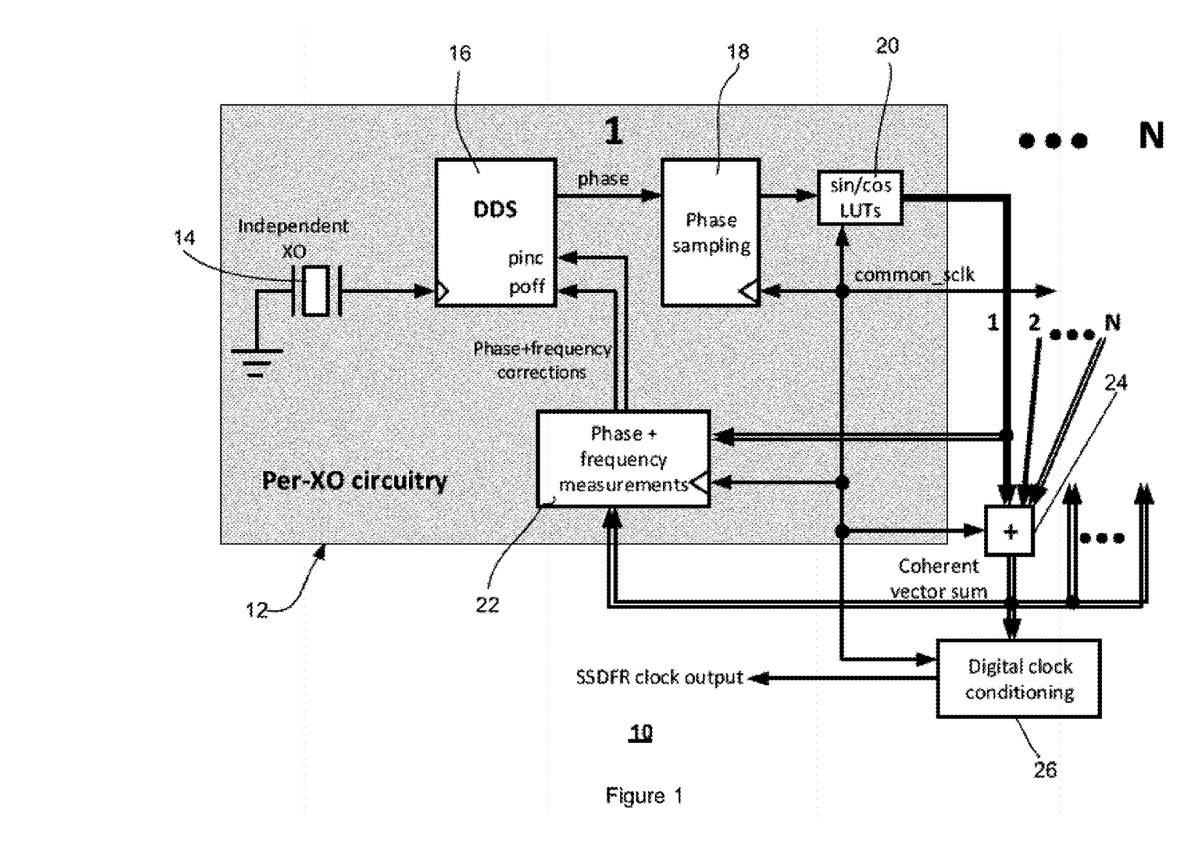
FIG. 1 shows a schematic of block diagram of an exemplary SSDFR implementation.

Referring to FIG. 1, there is shown a top-level component architecture diagram of a system for implementing a scalable stable digital frequency reference (SSDFR), as shown generally by reference numeral 10. A scalable array of digitally-synchronized, statistically-averaged, low-cost crystal oscillators is used as an alternative to the use of independent atomic clocks for aperture synthesis arrays of widely-separated radio antennas, among other applications. This implementation represents a unique case of incoherent clocking, as described in publication: Carlson, B. R., Incoherent clocking in coherent radio interferometers, IEE Electronics Letters (2018), 54 (14):909 (http://dx.doi.org/10.1049/el.2018.0964), which is hereby incorporated by reference, in which the antenna-to-central site duplex real-time link breaks real-time connectivity. Such a situation often arises when incoherent clocking is facilitated by a packet-switched network connection, and an ultra-stable reference clock at both the antenna and the central site could allow for coherence to be established. In addition to the cost savings, the use of such a scalable stable digital frequency reference simplifies image processing and increase observing efficiency, since one does not need to observe astronomical calibrators to measure atomic clock drift. System 10 comprises a plurality of independent crystal oscillator circuitry 12 comprising an independent crystal oscillator (XO) 14 for clocking direct digital synthesizer (DDS) 16, phase sampler 18, sin/cos look-up table (LUT) 20, and phase management block 22. Each of the plurality of independent crystal oscillator circuitry 12 is coupled to a coherent vector sum module 24, whose output is input into digital clock conditioner 26 which generates a SSDFR clock output. Alternatively, any suitable frequency sources may be employed instead of crystal oscillators, such as N atomic clocks or rubidium clocks, to achieve a factor of N improvement in frequency stability as well as have a precisely-known frequency, since the coupling mechanism is all-digital, rather than electrically coupled crystals, as described in the prior art.

Figure 2:
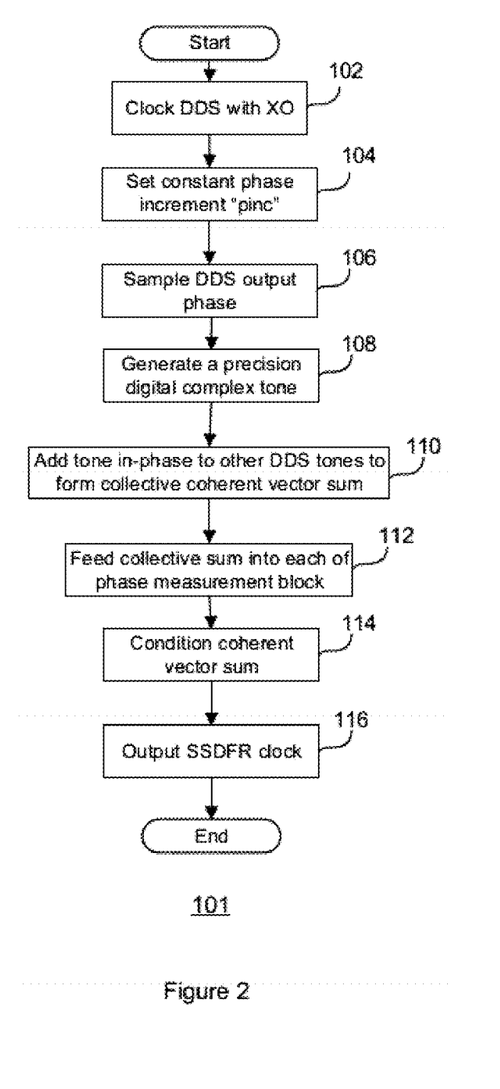
FIG. 2 shows a flowchart outlining exemplary steps for implementing a scalable stable digital frequency reference.

FIG. 2 shows flowchart 101 outlining exemplary steps for implementing the scalable stable digital frequency reference. In step 102, a clock source, such as an independent crystal oscillator 14, is provided as a first input into DDS 16 of each of independent crystal oscillator circuitry 12 to clock DDS's 16 logic. Next, in step 104, an initial value of a phase increment frequency ("pinc") per XO 14 clock cycle is set for each DDS 16 of each independent crystal oscillator 14 during initialization to align all DDSs 16 in frequency, however, phase increment frequency ("pinc") is updated to ensure the phase drift over the update period does not exceed predefined thresholds. The output phase of DDS 16 is sampled into a common synchronous clock domain (common_sclk) (106), where a precision digital complex tone is generated via sin/cos look-up table (LUT) (108), and added in-phase to other such DDS-generated tones to form a "collective" coherent vector sum (110). This collective sum is then fed back to each of N phase measurement blocks (112), where the phase and frequency changes after period T_ph (0.1 to 1.0 sec) are calculated and applied at the end of T_ph to the DDS's phase offset (poff) and frequency (pinc), to keep the DDS 16 output phase aligned to the collective, without phase-steering the XO 14 itself. Next, the collective is then conditioned (114) and formatted as an SSDFR clock output for external equipment use as required (116). The synchronous operations after phase sampling occur in the common_sclk domain; the absolute frequency and phase stability of common_sclk is not a requirement as long as the differential phase wander of any common_sclk at the phase sampling point, across any size system and relative to a central common_sclk, is not significant. To achieve this latter requirement, a digital round-trip phase-corrected distribution of common_sclk from a central node is envisioned (not shown), where any particular common_sclk's phase wander relative to a central reference is incorporated as an additional phase offset (poff) term into each DDS 16, effectively removing its effect on the collective.

Figure 3:
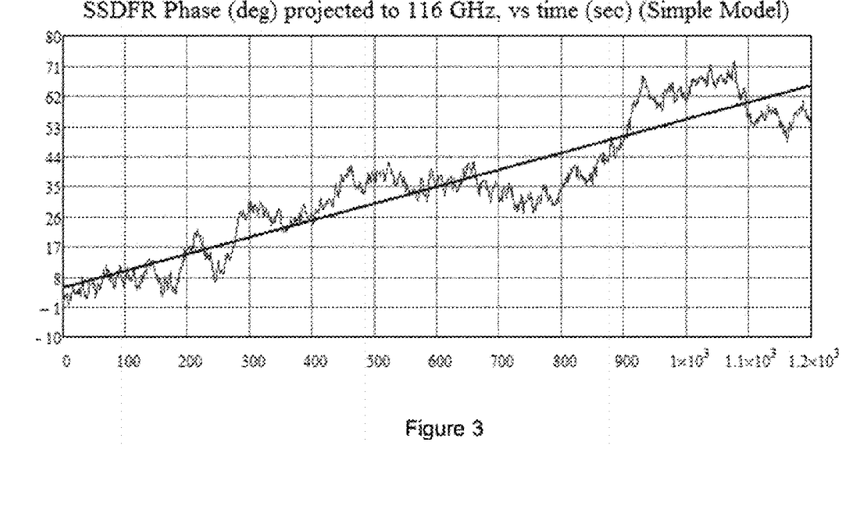
FIG. 3 shows an exemplary SSDFR model phase vs time (project to phase at 116 GHz, the highest ngVLA observing frequency) with 1000 crystals, each with an Allan Deviation of $10^{-12}$.

Initial mathematical modeling of the SSDFR concept using Gaussian phase wander, independently for each of N crystals, suggests the desired improvement in phase stability by a factor of N can be obtained. An example for T_ph=1.0 sec, and N=1000 crystals, each with an Allan Deviation of $10^{-12}$, extrapolated to phase at 116 GHz is shown in FIG. 3, with an RMS phase error about the least-squares-fit (solid diagonal line) phase slope of about 7 degrees, noting that the linear phase drift of the collective is inconsequential since it simply forms a component of the SSDFR's unknown frequency. In an implementation of the SSDFR concept as modeled, the statistical independence of all of the crystals is maintained by minimizing and/or controlling mechanical, voltage and thermal coupling.

Figure 4A:
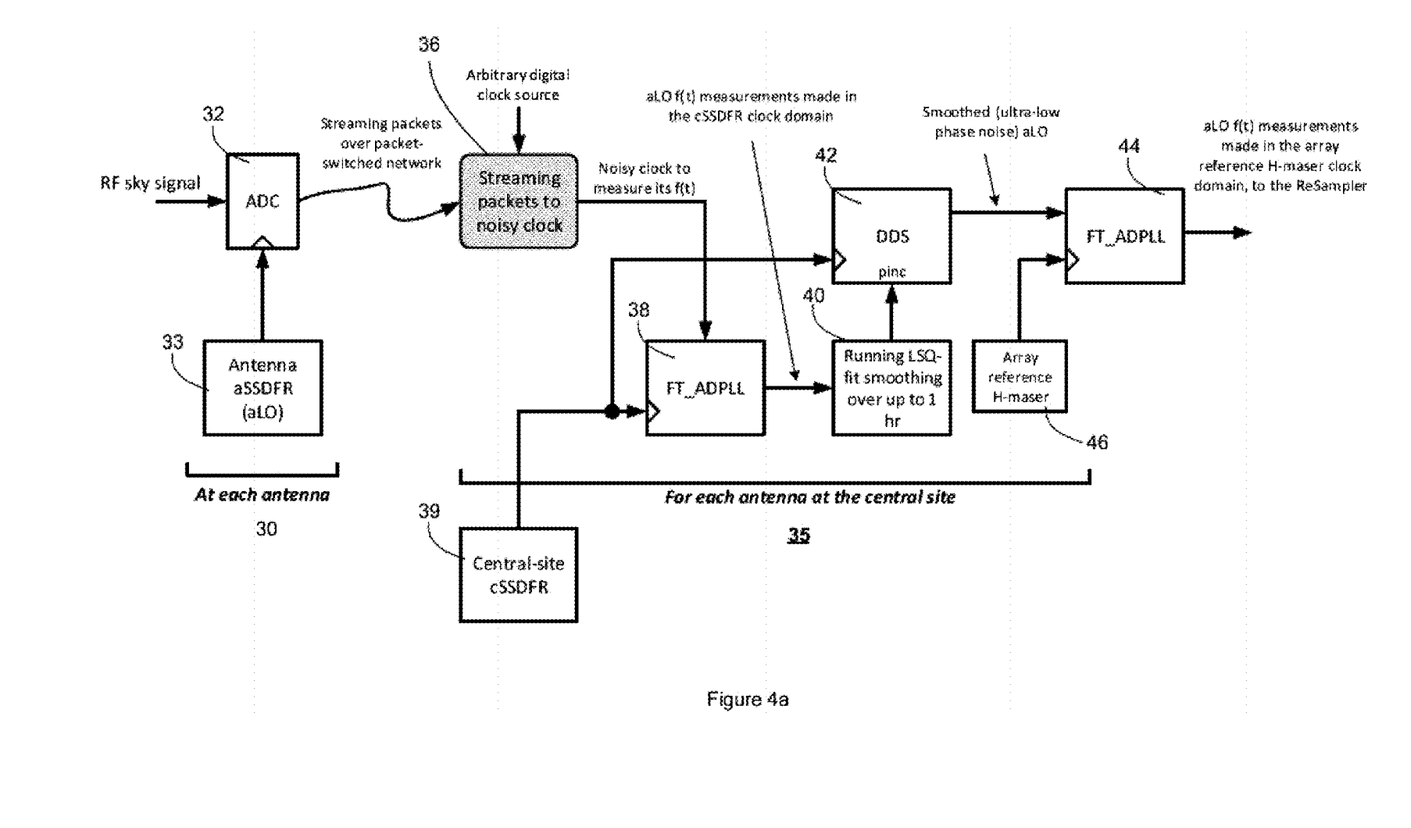
FIG. 4a shows a simplified notional block diagram using SSDFRs to establish radio telescope coherence over a packet-switched network.

Looking now at FIG. 4a, there is shown a simplified notional block diagram using SSDFRs to establish radio telescope coherence over a packet-switched network. An exemplary SSDFR PCB assembly is scalable to any number of N independent crystals. For example, the PCB assembly contains a single low-cost FPGA, at least 10 crystals, and an I/O interface to support connecting many such boards in a scalable hierarchy. In addition, the PCB assembly provides sufficient crystal phase vs time independence by ensuring that each crystal's power supply or thermal state does not cause significant dependence.

At antenna 30, a radio frequency signal is received and converted into a digital signal by analogue to digital converter (ADC) 32 clocked by aSSDFR (aLO) 33. The digitized packets are streamed over a packet-switched network and received by antenna 34 at a central site 35 streaming packets to noisy clock 36, and an output of noisy clock 36 is input into frequency tracking all-digital phase lock loop (FT_ADPLL) 38, which uses cSSDFR 39 as a reference clock at the central site. Coming out of FT_ADPLL 38 are measurements of the frequency of the packet generated clock which vary with time, and are smoothed over a predefined time period e.g. 1 hour using least squares (LSQ) fit calculator 40 to the last hour of data points. The output of LSQ fit calculator 40, updated every second for example, is input into DDS 42, which outputs a smoothed ultra-low phase noise clock (aLO). The smoothed ultra-low phase noise clock is fed into FT_ADPLL 44 which is clocked with an array reference H-maser 46 and the output is frequency versus time measurements of the smoothed ultra-low phase noise clock (aLO) measured in the reference H-maser clock domain. Accordingly, since all of the antennas operate in that clock domain, digital resampling of the data or digital correction may be performed before correlating or combining with the other antennas in the array.

Figure 4B:
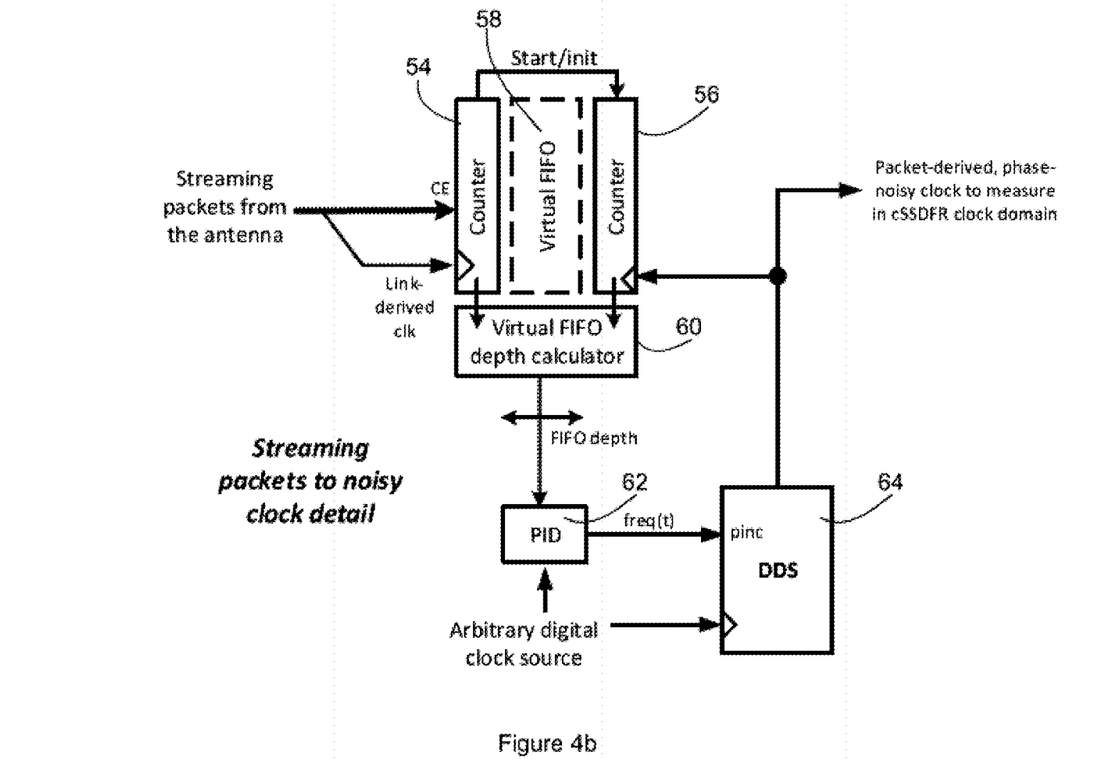
FIG. 4b shows streaming packets to noisy clock of FIG. 4a in more detail.

FIG. 4b shows streaming packets to noisy clock 36 of FIG. 4a in more detail, in which streaming packets from antenna 30 are received by a digital signal processor comprising write address counter 54 and read address counter 56, effectively forming a virtual FIFO buffer 58 and virtual FIFO depth calculator 60. As the data packets are received write address counter 54 is incremented each time there is a sample, and the read address counter 56 keeps up with write address counter 54 such that there are no collisions. Accordingly, virtual FIFO depth calculator 60 measures the depth of virtual FIFO buffer 58 by determining the delta in data samples between read address counter 56 and write address counter 54. The output from virtual FIFO depth calculator 60 is fed into proportional integral differential (PID) calculator 62, which then converts the depth into a frequency which is input into a phase increment component of direct digital synthesizer (DDS) 64. The output of DDS 64 clocks read address counter 56, such that the FIFO depth is maintained at a substantially constant depth as the packets stream in, even in situation where there are packet bursts, such that the frequency remains as stable as possible. Accordingly, the clock out of DDS 64 is a measure of the average sample rate of the data received from the antenna. The data samples from the antenna are digitized at the antenna with the antenna site aSSDFR, and over time, a plot of the frequency out of DDS 64 goes up and down in frequency but tracks the antenna site aSSDFR as time progresses. As packet-switched networks can experience packet bursts, packets may be missed, and such missed packets can be detected using packet counters, and therefore the counter may be incremented accordingly when the next packet comes in. Depending on the burst rate, the frequency of the input samples may be widely varying, and the loop smoothes this out to prevent buffer overflow or underflow. Accordingly, a clock is derived from the packets, and although this clock may be noisy compared to the reference clock at the antenna, that clock is tracking the reference clock at the antenna.

Figure 5A:
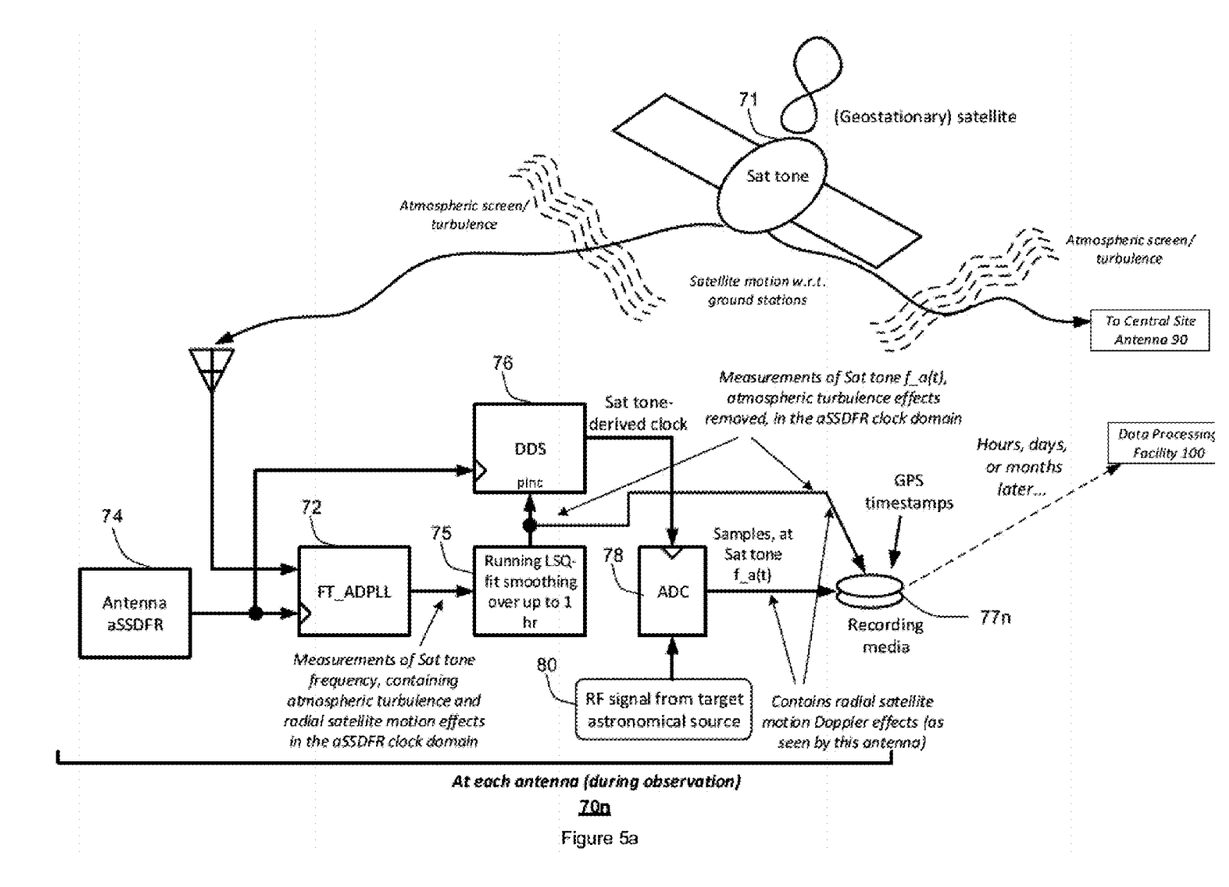
FIGS. 5a-5c show a simplified notional block diagram using SSDFRs to establish coherence over non-real-time communication links.
Figure 5B:
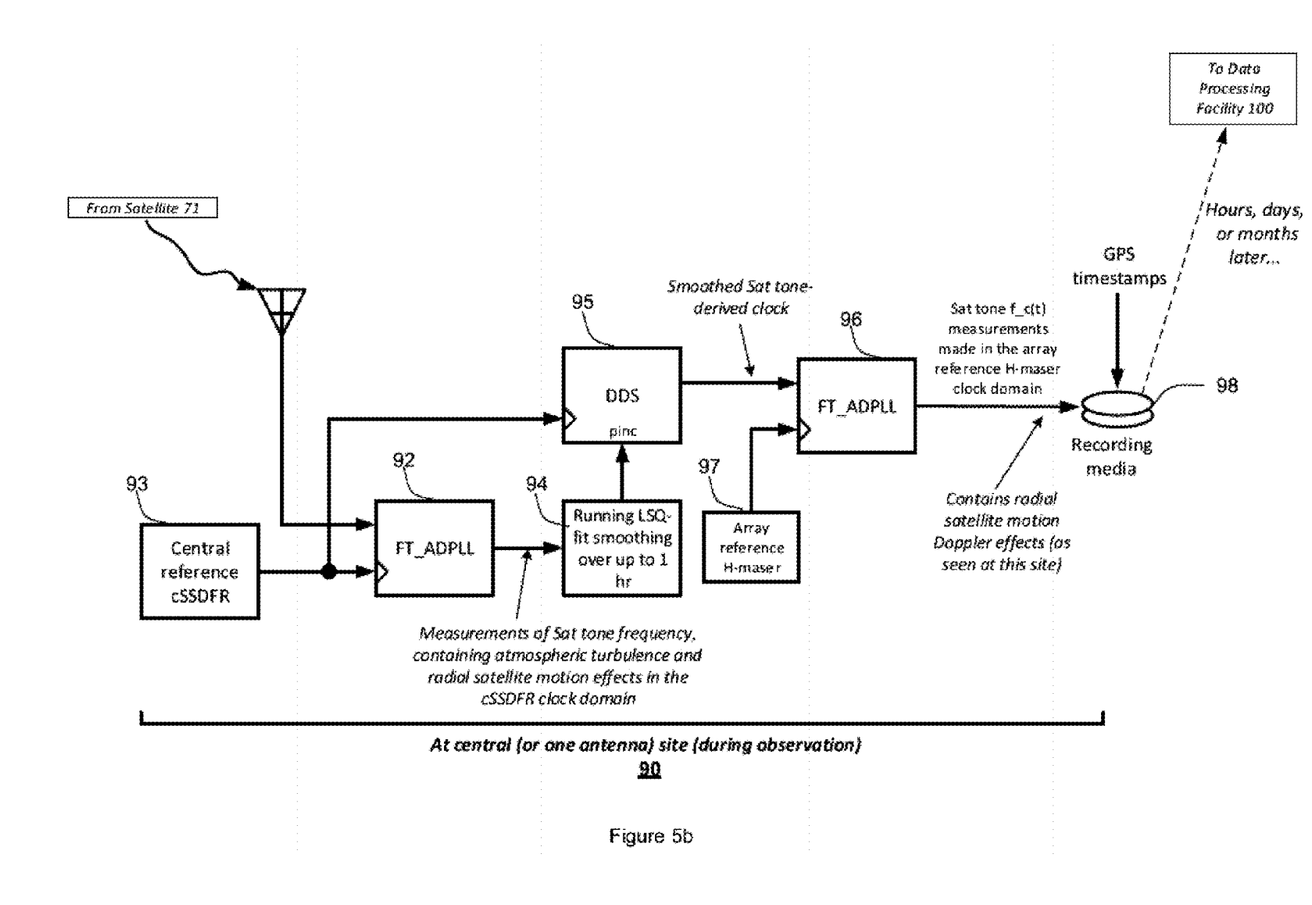
Figure 5C:
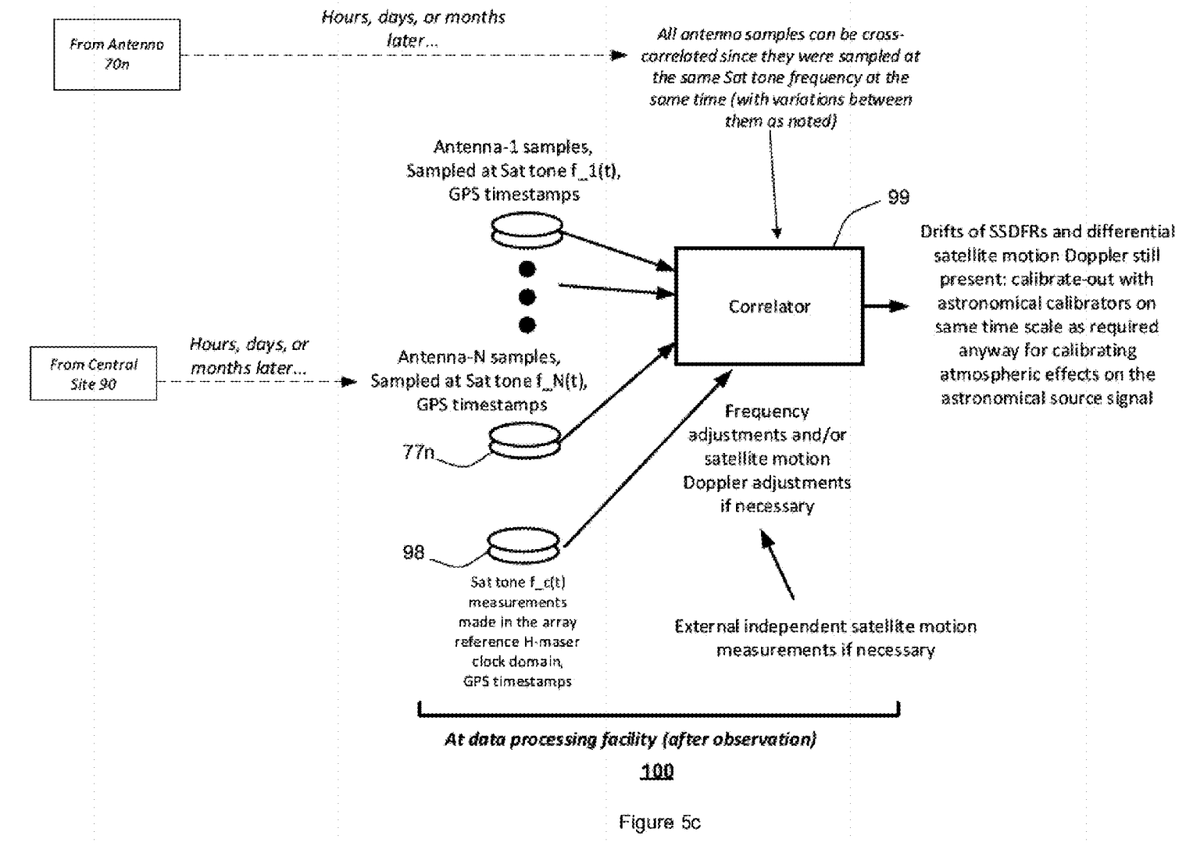

In another implementation, SSDFR is employed when a real-time communication link between the antenna and central site does not exist, as shown in FIGS. 5a to 5c. For example, the data at the antenna may be recorded on magnetic media, and therefore a communication link needs to be formed, and this link is formed using all the antennas, in which each antenna has its own SSDFR and the central site antenna has its own SSDFR.

Geostationary satellite 71 which produces a tone (Sat tone), and at antenna site 70n, a radio frequency signal is received from satellite 71 and input into frequency tracking all-digital phase lock loop (FT_ADPLL) 72, which uses aSSDFR 74 as a reference clock at the central site. Output from FT_ADPLL 72 are measurements of the Sat tone frequency containing atmospheric turbulence and radial satellite motion effects in the aSSDFR clock domain. These measurements vary with time, and are smoothed over a predefined time period e.g. 1 hour using least squares (LSQ) fit calculator 75 to the last hour of data points. The output of LSQ fit calculator 75 with measurements of Sat tone frequency f_a(t) in the aSSFDR clock domain, with atmospheric turbulence effects removed, is recorded on computer readable medium 77*n*. The output of LSQ fit calculator 75 is also input into DDS 76 clocked by aSSDFR 74, which outputs a smoothed Sat tone-derived clock.

Next, analogue to digital converter (ADC) 78 clocked by Sat tone-derived clock receives an RF signal from a target astronomical source 80, and outputs samples at Sat tone f_a(t), which is recorded on computer readable medium 77*n*, with global positioning system (GPS) time stamps.

At central site 90, a radio frequency signal is received from satellite 71, and similar to the operations at antenna site 70*n*, the radio frequency signal is input into frequency tracking all-digital phase lock loop (FT_ADPLL) 92, which uses cSSDFR 93 as a reference clock at the central site. Coming out of FT_ADPLL 92 are measurements of the frequency of the Sat tone frequency, containing atmospheric turbulence and radial satellite motion effects in the cSSDFR clock domain. These measurements vary with time, and are smoothed over a predefined time period e.g. 1 hour using least squares (LSQ) fit calculator 94 to the last hour of data points. The output of LSQ fit calculator 94 is input into DDS 95 clocked by cSSDFR 93, which outputs a smoothed Sat tone-derived clock. The smoothed Sat tone-derived clock is fed into FT_ADPLL 96 which is clocked with array reference H-maser 97 and output from FT_ADPLL 96 are Sat tone f_c(t) measurements made in the array reference H-maser clock domain, which are recorded on computer readable medium 98, with GPS time stamps.

As all of antennas 70*n* are trained on geostationary satellite 71 which produces the Sat tone, then all of antennas 70*n* and central site 90 observe the same tone at the same time. However, as each antenna 70*n* observes that tone through its own atmosphere then the phase or frequency of that tone is modulated differently for each antenna site, the tone from satellite 71 at antenna 70*n* is measured and the smoothing process, as described above, is employed and the smoothed output, which is the best measure of the satellite tone, is used to digitize the data. Accordingly, at each antenna 70*n*, the data is digitized using the best estimate smoothed ultra-low phase noise measurement of the satellite tone, and since all antennas 70*n* and central site 90 employ the same clock for measurements, then using H-maser reference clock 97, corrections may be performed and the data is correlated by correlator 99, at data processing facility 100.

In another implementation, digital clock conditioner 26 comprises a combination of digital and analogue circuitry.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises," "comprising," or any other variations thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

The preceding detailed description of exemplary embodiments of the invention makes reference to the accompanying drawings, which show the exemplary embodiment by way of illustration. While these exemplary embodiments are described in sufficient detail to enable those skilled in the art to practice the invention, it should be understood that other embodiments may be realized and that logical and mechanical changes may be made without departing from the spirit and scope of the invention. For example, the steps recited in any of the method or process claims may be executed in any order and are not limited to the order presented. Thus, the preceding detailed description is presented for purposes of illustration only and not of limitation, and the scope of the invention is defined by the preceding description, and with respect to the attached claims.

The invention claimed is:

1. A method for timing aperture synthesis arrays comprising
   (a) coupling a plurality of three or more independent crystal oscillators, each of the plurality of independent crystal oscillators having a unique output frequency;
   (b) digitally synchronizing the plurality of three or more independent crystal oscillators in phase;
   (c) combining the unique output frequencies; and
   (d) obtaining a stable digital reference signal for timing at least one remote radio device.

2. The method of claim 1, wherein the stable digital reference signal is at least one of scalable and stable relative to a common and unstable frequency reference signal.

3. The method of claim 2, wherein the stable digital reference signal is employed in timing at least one remote device.

4. The method of claim 3, wherein the at least one remote device is a radio telescope.

5. The method of claim 2, wherein the scalable stable digital frequency reference is used in conjunction with a packet-switched network communication link.

6. The method of claim 2, wherein the scalable stable digital frequency reference is used in conjunction with a non-real-time communication link.

* * * * *